(12) United States Patent
Nguyen et al.

(10) Patent No.: US 6,279,135 B1
(45) Date of Patent: Aug. 21, 2001

(54) ON-THE-FLY ROW-SYNDROME GENERATION FOR DVD CONTROLLER ECC

(75) Inventors: Hung Cao Nguyen, San Jose; Son Hong Ho, Los Altos, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/197,323

(22) Filed: Nov. 19, 1998

Related U.S. Application Data

(63) Continuation-in-part of application No. 09/124,334, filed on Jul. 29, 1998, now Pat. No. 6,115,837.

(51) Int. Cl.[7] .................................................. G11C 29/00
(52) U.S. Cl. ............................................ 714/769; 714/756
(58) Field of Search .................................... 714/769, 756, 714/770, 762, 761, 5, 18, 784, 785, 758; 341/94; 360/48, 40; 365/189.01, 51

(56) References Cited

U.S. PATENT DOCUMENTS

| | | | |
|---|---|---|---|
| 4,730,321 | * 3/1988 | Machado | 714/756 |
| 4,833,679 | * 5/1989 | Anderson et al. | 714/758 |
| 5,127,014 | 6/1992 | Raynham | 714/754 |
| 5,241,546 | * 8/1993 | Peterson et al. | 714/761 |
| 5,610,929 | * 3/1997 | Yamamoto | 714/785 |
| 5,623,504 | * 4/1997 | Tolhuizen | 714/755 |
| 5,650,955 | 7/1997 | Puar et al. | 365/51 |
| 5,978,954 | * 11/1999 | Ou et al. | 714/769 |
| 6,032,283 | * 2/2000 | Meyer | 714/746 |
| 6,047,395 | * 4/2000 | Zook | 714/756 |
| 6,115,837 | * 9/2000 | Nguyen et al. | 714/769 |
| 6,158,040 | * 12/2000 | Ho | 714/770 |
| 6,167,551 | * 12/2000 | Nguyen et al. | 714/770 |

OTHER PUBLICATIONS

"DVD Demystified", Jim Taylor, McGraw–Hill, 1997, pp. 120–136.

* cited by examiner

*Primary Examiner*—Albert Decady
*Assistant Examiner*—Guy Lamarre

(57) ABSTRACT

A digital-versatile disk (DVD) playback-controller integrated circuit (IC) writes data to a block in an embedded memory buffer while row syndromes are being generated in parallel. The block has rows and columns. Row syndromes are generated on-the-fly as the data is written from the DVD disk to the memory buffer. Row syndrome generation thus requires no memory access cycles. Column syndrome generation is delayed until row correction is completed. Once errors in the rows identified by the row syndromes are corrected, column syndromes are generated. The bytes received from the DVD disk for the current row are accumulated into intermediate row syndromes. Received bytes are accumulated for the row until all of the row's bytes have been received and accumulated. The final accumulated row syndromes are written to the embedded memory buffer for later row error-correction. The row syndromes are later sent from the embedded memory buffer to an error corrector that detects, locates, and corrects any errors in the rows. A separate SRAM buffer for error correction is eliminated even though on-the-fly performance is achieved.

15 Claims, 7 Drawing Sheets

FIG. 1
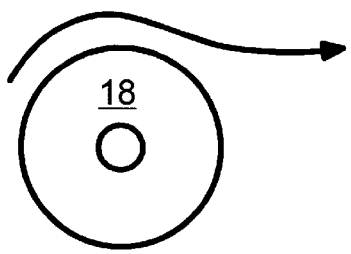
PRIOR ART
|  |  |  |  |  |  |  |
|---|---|---|---|---|---|---|
| 1 | 2 | ... | 171 | 172 | ECC | ROW 0 |
| 173 | 174 | ... | 343 | 344 | ECC | ROW 1 |
|  |  | ... |  |  |  | ⋮ |
| 32853 | 32854 | ... | 33023 | 33024 | ECC | ROW 191 |
| COL ECC | COL ECC | ... | COL ECC | COL ECC | ECC | ROWS 192-207 |
| COL 0 | COL 1 | ... | COL 170 | COL 171 | COLS 172-181 | |
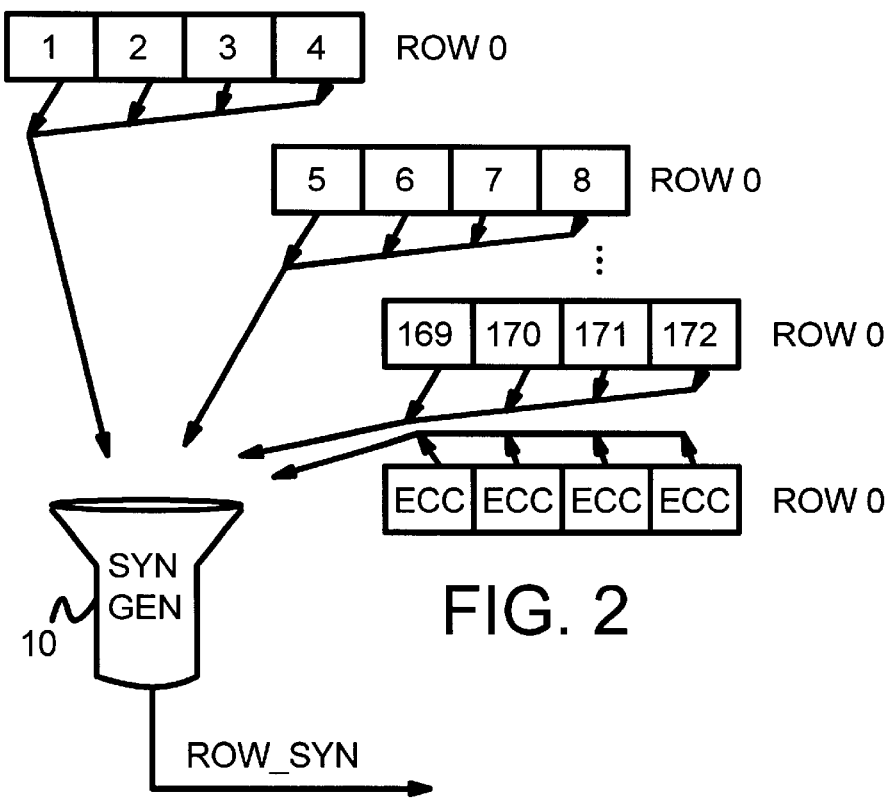
FIG. 2

ON-THE-FLY ROW-SYNDROME GENERATION FOR DVD CONTROLLER ECC

RELATED APPLICATION

This application is a continuation-in-part of the application for "Dual-Column Syndrome Generation for DVD Error Correction Using an Embedded DRAM", U.S. Ser. No. 09/124,334, filed Jul. 29, 1998, now U.S. Pat. No. 6,115,837.

FIELD OF THE INVENTION

This invention relates to error-correction code (ECC) systems, and more particularly to syndrome generation for error correction during digital-versatile disk (DVD) playback.

BACKGROUND OF THE INVENTION

The next generation of optical disks is known as digital-versatile disk (DVD). The CD-ROM drives on laptop and desktop PCs soon will be replaced with DVD drives. DVD has a much higher storage capacity than CD-ROM, enough that an entire motion picture can fit on a single DVD disk.

The large amount of data read during playback and the low-cost reproduction methods of optical disks increases the likelihood of encountering at least some errors on playback. Error detection and correction is thus important for CD-ROM's and DVD's. Smaller amounts of data such as stored in dynamic RAM memory often use parity—a bit is added to each data word so that the expanded word always has even or odd parity. Data from CD's and DVD's are arranged into larger blocks that have error-correction information appended. Multiple error-correction bytes allow errors to not only be detected, but also located and corrected. FIG. 1 illustrates a DVD data block with error correction for both rows and columns. Data from DVD disk 18 is read sequentially and stored in a block of data. As the data is read from DVD disk 18, it begins filling row 0 with data bytes 1, 2, 3 . . . until 182 bytes have been read. Error-correction information (ECC) for row 0 is contained in the last ten bytes of the row. Data from DVD disk 18 then begins filling the second row (row 1) with data bytes 173, 174, etc. until a second row of 172 data bytes and 10 ECC bytes has been transferred. Additional ECC bytes for the second row are contained in the last 10 bytes of row 1.

Subsequent rows of data and row-ECC information are read from DVD disk 18 and stored in a buffer memory block until all 192 rows of data have been transferred. Finally, sixteen rows of ECC bytes are read. ECC bytes in the final 16 rows are error-correction bytes for columns of data. For example, the first ECC byte in each of the last 16 rows is for column 0, which includes data byte 1 from row 0, data byte 173 from row 1, . . . , and data byte 32853 for data row 191, a total of 192 data bytes, each from a different row.

The final ten bytes of each row in the final 16 rows contains ECC information for the final 16 rows of column ECC bytes. This ensures that errors in the column ECC bytes can be detected and corrected.

Row and Column ECC

The ECC bytes at the end of a row can be used to detect, locate, and correct one or more errors within the row, but do not contain information on errors in other rows. Sometimes errors are too numerous to be detected or corrected in a row. Then the column ECC bytes can be used to find and correct the errors that are uncorrectable by the row ECC bytes. The ECC bytes at the bottom of a column are used to detect, locate, and correct one or more errors within the column, but do not contain information on errors in other columns. Column ECC provides a redundancy to error correction, allowing more difficult errors to be corrected.

Often the data and ECC bytes from the DVD disk are stored in a temporary buffer such as a static RAM buffer. Rows and columns are read to generate syndromes for each row and for each column. Syndromes are signatures or checksums formed by using a pre-defined mathematical operator on all data bytes and ECC bytes of a row or column. Polynomial operators are often used.

The syndromes are then compared to a pre-defined signature of zero to detect any errors in the row or column. The syndromes are also used to locate and correct a detected error. Complex algorithms such those based on Reed-Solomon code are used with the ECC bytes as is well-known in the art.

Multi-Byte Fetch for Row-Syndrome Generation—FIG. 2

FIG. 2 highlights that multiple bytes can be fetched from buffer memory for row syndrome generation. A syndrome for a row is generated by "summing" all the data and ECC bytes for a row. This "summing" is not a standard addition, but rather a complex signature-generating operation of scaling and adding the 182 bytes in a row. Multiple cycles can be used, such as by adding one byte per cycle to a running scaled sum.

Syndrome generator 10 performs the signature-generating operation as the bytes from the row are input. The buffer memory containing the data block often can read out multiple bytes per cycle. Thus FIG. 2 shows four-byte reads. In a first cycle, bytes 1, 2, 3, 4 are read from the buffer memory and operated on by syndrome generator 10. In a next memory cycle, data bytes 5, 6, 7, 8 are read from memory and accumulated by syndrome generator 10, adjusting the syndrome. Each successive memory cycle can read four bytes at once when the buffer memory is a standard 32-bit memory.

Once all 172 data bytes have been read and accumulated by syndrome generator 10, then the final 10 ECC bytes are read and accumulated. The final accumulated value in syndrome generator 10 is the row syndrome for the current row. Once the row syndrome is latched, syndrome generator 10 is cleared and the process repeated for next row.

Column Syndrome Generation—FIG. 3

FIG. 3 highlights column-syndrome generation. For column-syndrome generation, all of the bytes in a column are fetched from the buffer memory and input to syndrome generator 10. Only one byte from each row is needed. For column 0, byte 1 of row 0 is 1 fetched and input to syndrome generator 10. Since four bytes are always read, bytes 2, 3, 4 are also read, but not needed.

In the following memory cycle, data byte 173 is read from row 1, along with bytes 174, 175, 176. Only byte 173 is input to syndrome generator 10; fetched bytes 174, 175, 176 are discarded. For each succeeding row, one byte (at column 0) is read and input to syndrome generator 10, while three bytes are fetched and discarded (for columns 1, 2, 3).

Finally the last data byte 32,853 is read from row 191. Then during the next 16 memory cycles the 16 ECC bytes for column 0 are read and input to syndrome generator 10. After the last ECC byte has been read and accumulated by syndrome generator 10, the output from syndrome generator 10 is the column syndrome for column 0. The column syndrome can be latched, syndrome generator 10 cleared, and the process repeated for the second column. Then the second byte is input to syndrome generator 10 and the first, third, and fourth bytes discarded from each 4-byte fetch.

A total of 208 memory access cycles are required to fetch one byte from each of the 208 rows for column-syndrome generation. Using moderately wider fetches does not help, since adjacent bytes in a column are 182 bytes apart in the physical memory, separated by an entire row.

On-The-Fly ECC with SRAM Buffer—FIG. 4

FIG. 4 shows a prior-art optical-disk controller that uses a fast SRAM buffer for error correction. Error correction occurs "on-the-fly" as the data is read off optical disk 18 so that the data is corrected before being written to DRAM host buffer 64. Data read from optical disk 18 is first written to static-RAM buffer 60. Rows and columns of data are read from SRAM buffer 60 by error corrector 62 to generate row and column syndromes. When non-zero syndromes are found, the location and value of errors in a row are calculated and a read-modify-write cycle used to update the data in SRAM buffer 60 with the correction. Once all corrections are made, the corrected data in SRAM buffer 60 is moved to host-buffer 64. Host buffer 64 is a larger DRAM memory that can hold several blocks of data for transfer to the host.

SRAM buffer 60 is a much higher-speed memory than DRAM host buffer 64, allowing error corrector 62 to rapidly read and write the data being corrected. However, the higher cost of SRAM memory places limits on the size of SRAM buffer 60, so that only one or a few blocks can be present in SRAM buffer 60 at any time. DRAM host buffer 64 is much larger in size than SRAM buffer 60, allowing many corrected blocks to be buffered to the host at any time. Conventional DRAM memories have a limited bandwidth that is typically insufficient for instant error correction as the data is read from optical disk 18.

Many Reads and Writes for Error Correction—FIG. 5

FIG. 5 highlights that many reads and writes may occur during error correction. SRAM buffer 60 has a fast access time, allowing several reads and writes to occur during the time that one DRAM read occurs. Thus SRAM buffer 60 has a high bandwidth by virtue of the fast access time of static memories.

Data read from optical disk 18 is written to SRAM buffer 60. Once a row of an ECC block has been written, row syndrome generator 70 reads the data and ECC bytes in the row, and generates row-syndrome bytes. These row syndrome bytes can be written back to SRAM buffer 60, or put into a temporary latch and sent to row ECC calculator 72. Row ECC calculator 72 compares the row syndrome bytes to zero to detect errors in the row. When an error is detected, row ECC calculator 72 locates the error within the row and determines the error value. The error value is exclusive-OR'ed with the data in the row to correct the error. Row ECC calculator 72 performs a read-modify-write cycle to read the incorrect data from the row in SRAM buffer 60, XOR the error value to generate the corrected data, and then write the corrected data back into SRAM buffer 60.

Once row corrections are made for all rows in the ECC block, column syndromes are generated and column corrections made. Column syndrome generator 74 reads a column byte from each of the rows in SRAM buffer 60 and generates the column syndrome. The column syndrome is sent to column ECC calculator 76, which compares the column syndrome bytes to zero to detect errors in the column. When an error is detected, column ECC calculator 76 locates the error within the column and determines the error value. The error value is exclusive-OR'ed with the data in the column to correct the error. Column ECC calculator 76 performs a read-modify-write cycle to read the incorrect data from the column in SRAM buffer 60, XOR the error value to generate the corrected data, and then write the corrected data back into SRAM buffer 60.

Finally the corrected data is read and sent to the DRAM host buffer to make room for new data from optical disk 18. Each data and ECC byte is written at least once to SRAM buffer 60 and read at least three times—for the row and column syndromes, and for transfer to the host buffer. An additional read and write occur for every error. Thus from 1–3 writes and 3–5 reads can occur for any byte. This high bandwidth requirement has led designers to use expensive SRAM buffers for on-the-fly error correction.

While such SRAM buffers are effective, they add expense and complexity to optical-disk controllers. There is some redundancy to having both an SRAM and a DRAM buffer. This redundancy is wasteful. The alternative of using just a DRAM buffer may stall the reading of the optical disk while error correction occurs, slowing performance.

What is desired is a high-speed optical-disk playback system. It is desired to perform error correction or detection as quickly as possible, so that error correction does not force the disk to stall while error correction occurs. A virtual on-the-fly error corrector is desired that does not use an expensive SRAM buffer. It is desired to use a DRAM buffer for error correction. It is further desired to reduce bandwidth requirements for error correction to improve the performance of the error correction. A more efficient row syndrome-generation system is desired. It is desired to improve performance of row syndrome generation.

SUMMARY OF THE INVENTION

A partially on-the-fly syndrome generator system for error-correction has a disk interface. The disk interface is coupled to receive uncorrected data words read from an optical disk. A buffer memory is coupled to receive the uncorrected data words from the disk interface. It stores the uncorrected data words as a block of data words and error-correction words for the data. The block includes rows and columns.

A row-syndrome generator is coupled to receive the uncorrected data words directly from the disk interface. It generates a row syndrome for each row in the block. The row-syndrome generator outputs a row syndrome for detecting errors in the row.

A column-syndrome generator is coupled to the buffer memory. It reads data words of a column in the buffer memory from all rows in the block. The column-syndrome generator has registers for storing a column syndrome. The column syndrome detects errors in the column.

Thus the row syndrome is generated on-the-fly from the uncorrected data words received directly from the disk interface, but the column syndrome is generated by reading data words from the buffer memory.

In further aspects of the invention the row-syndrome generator does not read the data words from the buffer memory. Thus buffer reads for row-syndrome-generation are eliminated.

In further aspects an error corrector reads the row syndrome. It detects an error in the row by examining the row syndrome. The error corrector locates and corrects an error detected in the row by writing to the column in the buffer memory. Thus the error corrector corrects row errors. The error corrector further detects, locates, and corrects errors in columns by examining the column syndrome from each column and writing a correction to the buffer memory. Thus the error corrector corrects column errors too.

In further aspects the error corrector is pipelined with the column-syndrome generator. The error corrector is a shared corrector used for correcting column errors and used for correcting row errors. The error corrector corrects errors for all rows of the block before the column-syndrome generator fetches data words from the block. Thus the data words in the block are first corrected using row syndromes before the column syndromes are generated.

In other aspects the row-syndrome generator writes the row syndrome to the buffer memory. The error corrector reads the row syndrome from the buffer memory. The error corrector detects, locates, and corrects errors in the row by writing corrections to the row in the buffer memory. Thus the row syndrome is stored in the buffer memory until error correction.

BRIEF DESCRIPTION OF THE DRAWINGS

FIG. 1 illustrates a DVD data block with error correction for both rows and columns.

FIG. 2 highlights that multiple bytes can be fetched from buffer memory for row syndrome generation.

DETAILED DESCRIPTION

The present invention relates to an improvement in row-syndrome generation for error correction. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that not all of the error correction process needs to occur on-the-fly, as long as the average data throughput of the error corrector is as high as the disk read rate. A virtual on-the-fly error corrector is contemplated that performs some of the error correction steps on-the-fly, as the data comes off the optical disk, but other error-correction steps are pipelined and occur later. In particular, row-syndrome generation is performed on-the-fly, while other steps are performed later, once the ECC data block has been read into a buffer.

Figure 3:
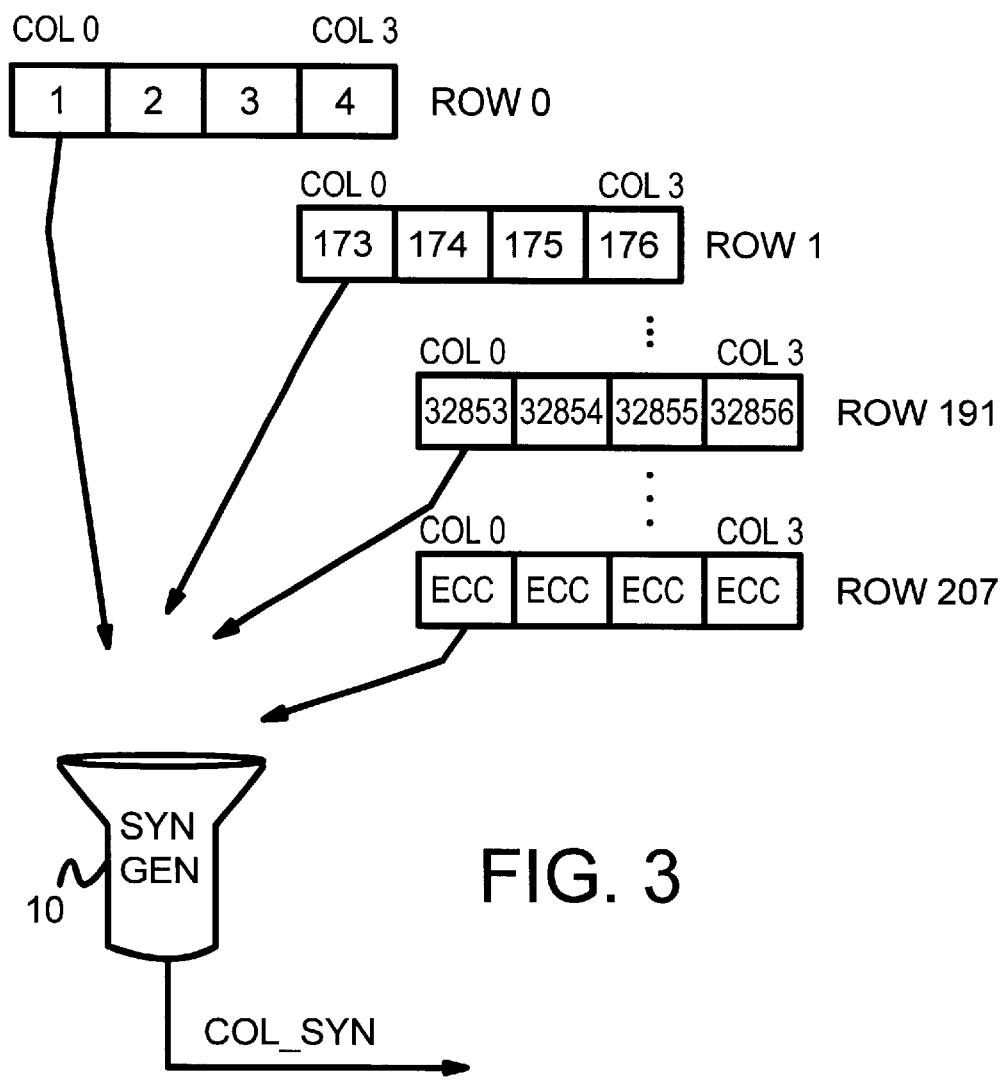
FIG. 3 highlights column-syndrome generation.
Figure 4:
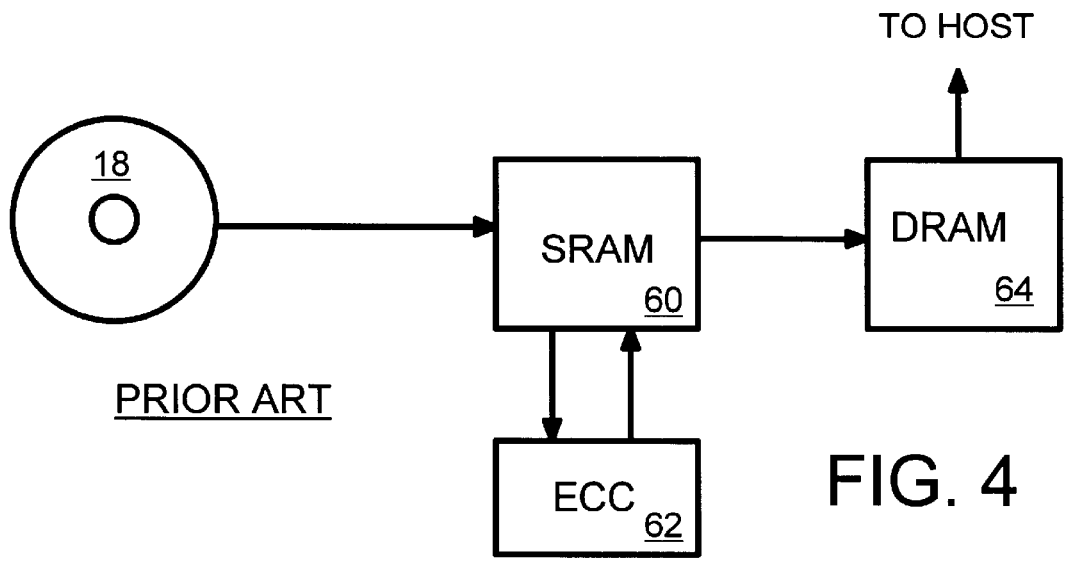
FIG. 4 shows a prior-art optical-disk controller that uses a fast SRAM buffer for error correction.
Figure 5:
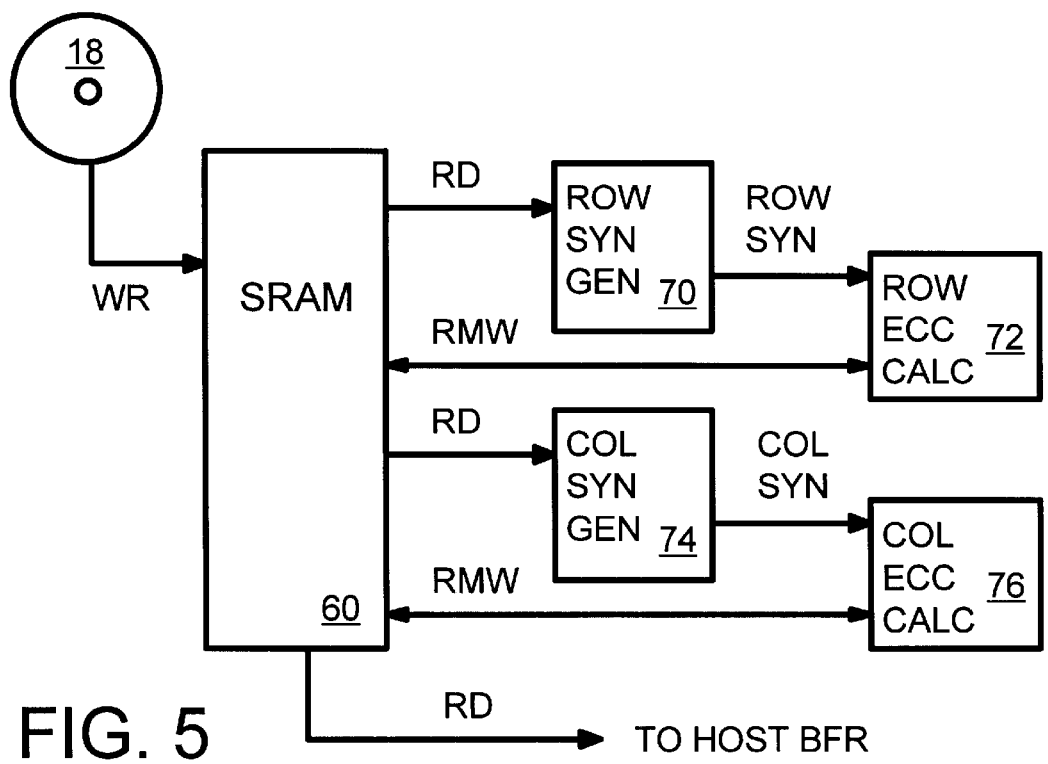
FIG. 5 highlights that many reads and writes may occur during error correction.

Using such partial on-the-fly error correction can eliminate the separate SRAM buffer of FIG. 4. Instead, error correction is performed on the data block in the DRAM. Once the data block has been corrected, it can be moved to a host-buffer region of the DRAM for later transfer to the host.

An embedded DRAM is used. Since the embedded DRAM is contained within the same silicon substrate as the error corrector, a wide data path can connect the embedded DRAM to the error corrector. This wide data path vastly increases the available bandwidth of the buffer. The faster access time of the SRAM buffer is not needed when the overall bandwidth is high.

The inventors have further realized that the row syndromes can be generated "on-the-fly", as the data from the optical disk is being written into the embedded DRAM buffer. The row syndromes are generated in parallel with the data writes to the embedded DRAM. Data from the optical disk is sent to both the buffer and to the row syndrome generator. The row syndrome generator no longer has to read all the bytes in each row from the buffer. One of the reads of all bytes in the ECC data block is thus eliminated using on-the-fly row-syndrome generation.

The row syndromes are generated quickly, being available for error detection and correction almost immediately after the entire row has been received. Eliminating the DRAM read for row-syndrome generation frees up bandwidth of the embedded DRAM, making access bandwidth available for other tasks, such as for writes from disk, and for column-syndrome generation reads or for host buffering reads.

Figure 6:
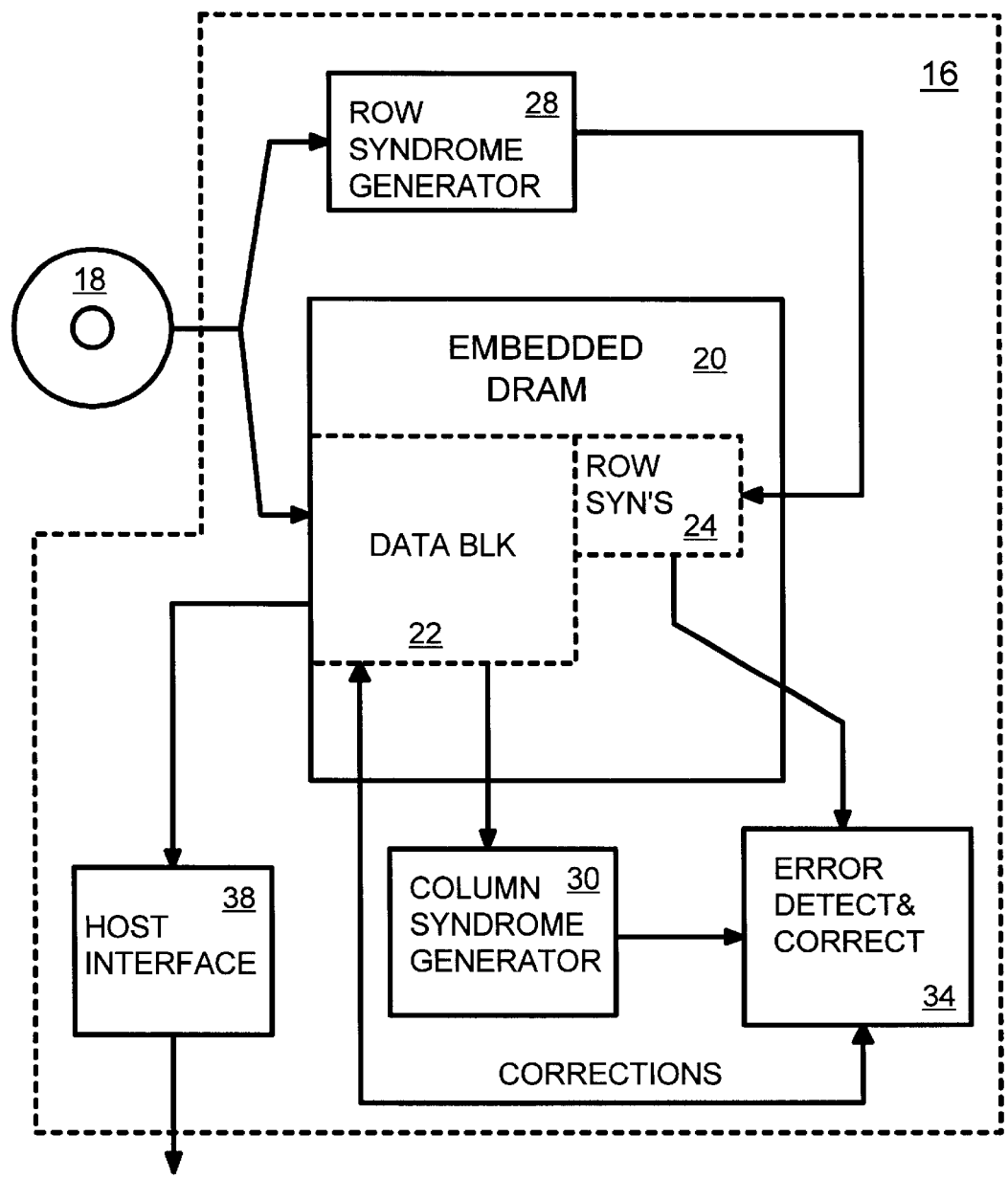
FIG. 6 is a diagram of a DVD controller chip with an embedded DRAM and on-the-fly row-syndrome generation but delayed column-syndrome generation and correction.

DVD Controller with Embedded DRAM Buffer—FIG. 6

FIG. 6 is a diagram of a DVD controller chip with an embedded DRAM and on-the-fly row-syndrome generation but delayed column-syndrome generation and correction. Embedded dynamic random-access memories (DRAMs) have been developed by the assignee and widely used in graphics accelerators for notebook personal computers. See for example, "Graphics Controller Integrated Circuit Without Memory Interface", U.S. Pat. No. 5,650,955.

Data is read from DVD disk 18 and into DVD controller chip 16. DVD controller chip 16 is an integrated circuit that may include a DVD controller that interfaces with the electronics of an external DVD disk player. The error correction and data paths of DVD controller chip 16 are shown in FIG. 6 while other portions are not shown.

Embedded DRAM 20 is a large 512-Kbyte memory array within DVD controller chip 16. Dynamic rather than static memory is used to allow for a much larger memory capacity. Since each data block 22 occupies at least 208×192 bytes (37856 bytes including ECC), embedded DRAM 20 can hold 13 data blocks 22. As is shown later in FIG. 7, the large capacity of embedded DRAM 20 allows for pipelining of several data blocks, improving performance. A smaller SRAM memory would not have enough capacity for storing several data blocks in a pipeline. A refresh controller (not shown) refreshes the DRAM.

On-The-Fly Row Syndrome Generation

Data read from DVD disk 18 to DVD controller chip 16 is written to data block 22 in embedded DRAM 20. As each data byte is read into DVD controller chip 16, it is also sent to row syndrome generator 28. Row syndrome generator 28 generates ten row syndrome bytes for the current row being written to embedded DRAM 20 by accumulating each data and row ECC byte into registers storing the row syndrome. Once the last ECC byte in a row is written to embedded DRAM 20 and accumulated by row syndrome generator 28, the registers in row syndrome generator 28 are copied to embedded DRAM 20 and stored as the row syndrome for the row just written. Address pointers are used to locate the current row syndrome being written in row syndrome storage 24 within embedded DRAM 20.

Row syndrome generator 28 is cleared as the next row of data and ECC bytes begins to be read from DVD disk 18. The row syndrome for the next row is generated as row syndrome generator 28 accumulates each byte as each byte is written into data block 22 of embedded DRAM 20. Once all data and ECC rows are written to data block 22, a new area of embedded DRAM 20 is set aside for the next data block. The data stream from DVD disk 18 is then written to rows in the next data block.

Generating the row syndrome as the data is being written to data block 22 of embedded DRAM 20 frees up memory bandwidth since no fetches are needed for row-syndrome generation of data block 22. Data and ECC bytes are simultaneously written to data block 22 of embedded DRAM 20 and to row syndrome generator 28. Of course, pipeline and arbitration delays can exist in one path or the other so that row-syndrome generation is advanced or delayed relative to the actual DRAM write.

Once at least one row of data block 22 has been transferred from DVD disk 18 to embedded DRAM 20, rows are checked for errors and error correction is attempted. Error detector and corrector 34 reads the first row's syndrome bytes from row-syndrome storage 24 of embedded DRAM 20 and compares each byte of the generated row syndrome to a predetermined syndrome of zero for all row syndromes. If the syndromes match, no error is detected and error detector and corrector 34 reads the next row's syndrome from row syndrome storage 24. Each of the ten bytes of a row syndrome must match zero. A non-zero syndrome byte indicates an error in the row. When error detector and corrector 34 detects an error, error correction is attempted on the row. The location of the error or errors is determined using standard but complex techniques, such as solving a Euclidean Algorithm and Chien search using the generated row syndrome and initial conditions. The error location and the error value (difference) are solved for. See for example, U.S. Pat. No. 5,027,357 by Yu et al. which uses a Reed-Solomon code such as the X3B11 standard and U.S. Pat. No. 5,517,509 by Yoneda that describes decoding ECC and locating errors using Euclid's algorithm and a Chien search.

When error detector and corrector 34 successfully locates an error in the row, the row is corrected by performing a read-modify-write cycle at the location of the error within data block 22 in embedded DRAM 20. Many clock cycles of computation may be required to detect and correct errors. Some detected errors may not be correctable with only the row syndrome. A flag can be set when such uncorrectable errors are detected. The column syndromes are later used to attempt to correct these errors that are not correctable by the row syndromes.

Column Syndrome Generation After Row Corrections

Once the last row of data block 22 has been transferred from DVD disk 18 to embedded DRAM 20, and once error detector and corrector 34 has corrected all rows of data block 22, column syndromes are generated. It is necessary to wait for column-syndrome generation until all possible row corrections have been written to data block 22, so that fewer errors need to be corrected using the column syndromes.

Column syndrome generator 30 reads one or more columns of data from data block 22 and generates one or more column syndromes for the columns read. Since the data and ECC bytes are read from DVD disk 18 and written to embedded DRAM 20 in row order, the bytes in a column are separated by an entire row, 182 bytes. As this is much larger than the width of the memory fetch, separate fetches are required for each byte in the column. Each of the column's bytes is in a separate row.

Using the dual-column syndrome generation highlighted in the parent application, two or more columns can be processed at the same time. Column syndrome generator 30 fetches one or more bytes from a row in data block 22 in each memory fetch cycle. The fetched bytes are accumulated into the syndromes for one or more columns, while the other fetched bytes are discarded. After fetches for all the rows of a column, the column syndromes are latched into error detector and corrector 34. Column syndrome generator 30 then fetches the next columns of data bytes, starting with row 0 of data block 22.

The column syndromes latched into error detector and corrector 34 are processed serially, since error detector and corrector 34 can only process one column at a time. The first column syndrome is compared to an expected column syndrome (all zeros). A mismatch detects an error in the column. The location of the error and the correction required are generated by error detector and corrector 34. The correction is made by a read-modify-write cycle to data block 22. Should a column error be uncorrectable, the entire data block can be re-read from DVD disk 18, or the host can be flagged.

Once all column syndromes have been generated, and all columns corrected, error correction is completed for data block 22. Host interface 38 transfers data block 22 to a host interface such as a PCI or ATAPI bus on a personal computer or an internal bus on a TV-set-top DVD player. Host interface 38 ignores the ECC bytes, transferring only the data bytes. Once all rows of data are transferred from embedded DRAM 20 to the host, data block 22 can be marked invalid and the storage area re-used for another data block from DVD disk 18.

Figure 7:
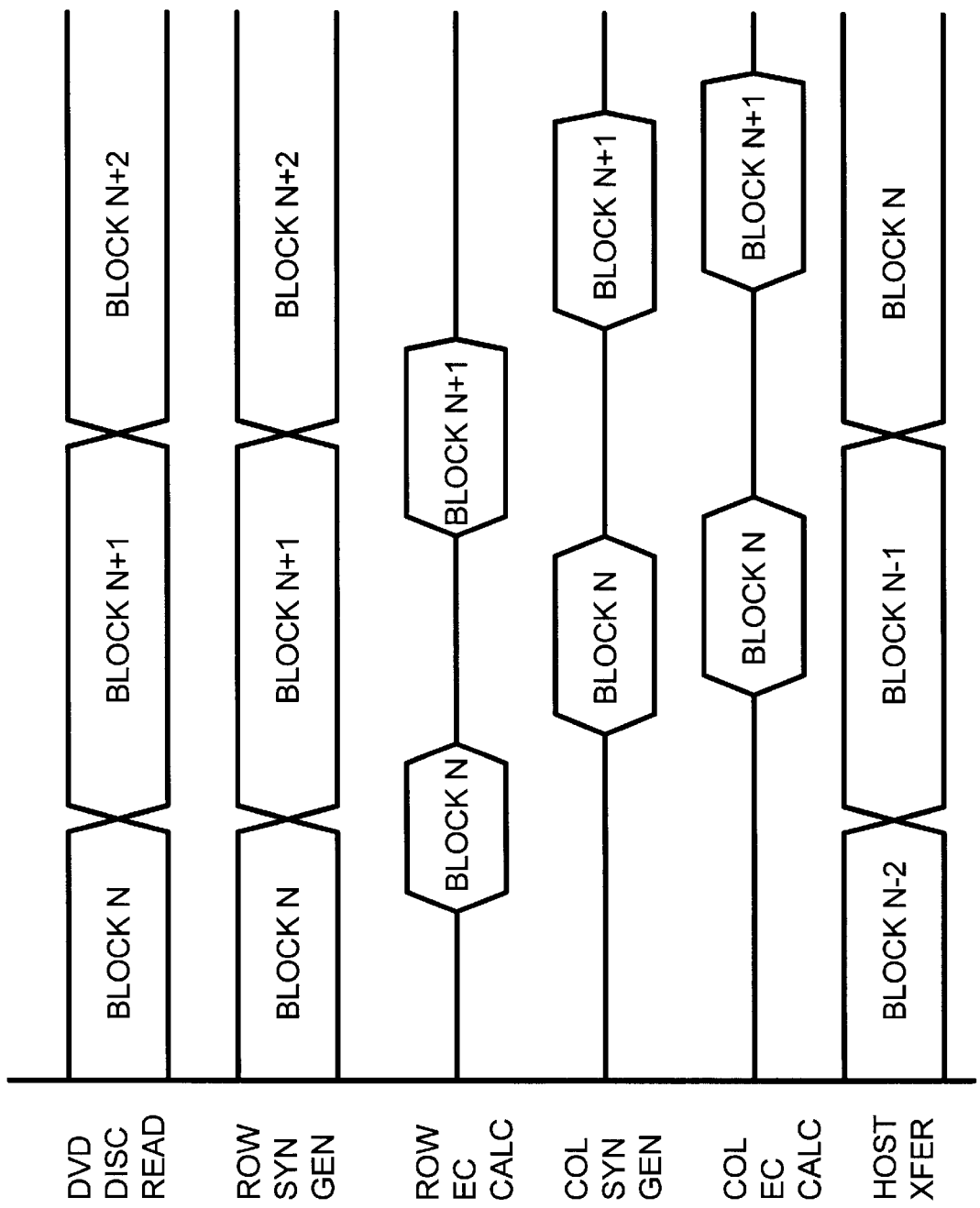
FIG. 7 illustrates the pipelining of blocks of DVD data during error detection and correction.

Pipelining of DVD Blocks—FIG. 7

FIG. 7 illustrates the pipelining of blocks of DVD data during error detection and correction. A DVD block has 208 rows each with 182 bytes, including ECC bytes. Data and ECC bytes for all 208 rows of DVD block N are read from the DVD disk and written to the embedded DRAM. As each row is read from the DVD disk and written to the embedded DRAM buffer, the row syndrome is generated. Thus all the row syndromes for DVD block N are generated at about the same time the data is read from the DVD disk.

The following DVD blocks N+1 and N+2 likewise are read from the DVD disk and written to the embedded DRAM while the row syndromes are generated and written to the embedded DRAM on the fly. This is shown by the upper two waveforms of FIG. 7.

Error detection and correction (EC) for the rows of DVD block N can begin once at least the first row has been written to the embedded DRAM. As shown in FIG. 7, EC calculations begin near the end of reading block N and continue through while the first rows of next block N+1 are read from the DVD disk. EC calculations require less time than does reading the block from the DVD disk, since reading from the optical DVD disk is relatively slow.

As the row EC calculations are performed, any detected errors are corrected by over-writing the faulty data in the embedded DRAM. Once all row corrections are completed, the partially-corrected DVD block in the embedded DRAM is read, column-by-column, for generating the column syndromes. After each column is read and its column syndromes generated and latched, the error detector and corrector calculates the error location and error value of any errors in each column. Corrections are written to the columns in the embedded DRAM. Since each column is corrected just after its syndrome is generated, all 182 column syndromes do not have to be stored at the same time. The column EC calculation waveform "COL EC CALC" overlaps the column syndrome generation "COL SYN GEN" waveform but is delayed by one group of columns.

The error detector and corrector is first used for row error detection and correction for block N, and later used for column error detection and correction for the same clock N. The same error detector and corrector engine is used for both row and column corrections. Column error detection and correction does not occur until the next DVD block N+1 is being read from the DVD disk. The column syndromes for a block are generated while the next block's row syndromes are being generated. Thus row and column syndrome generation is pipelined.

Once all the column corrections are completed, the DVD block is clean and ready to be transferred to the host. Host transfer for DVD block N occurs while DVD block N+2 is being read from the DVD disk to the embedded DRAM. Thus each DVD block is pipelined for a period about equal to the read time for 2 DVD blocks. The host can transfer data as soon as column error correction finishes.

Such a pipeline requires that up to 3 DVD blocks be stored in the embedded DRAM buffer, along with the row syndromes for about one and a half blocks. Each block is about 40 Kbytes, with overhead, so a total memory of 120 Kbytes is needed for the 3-block-deep pipeline. This is about a 1-megabit memory.

Figure 8:
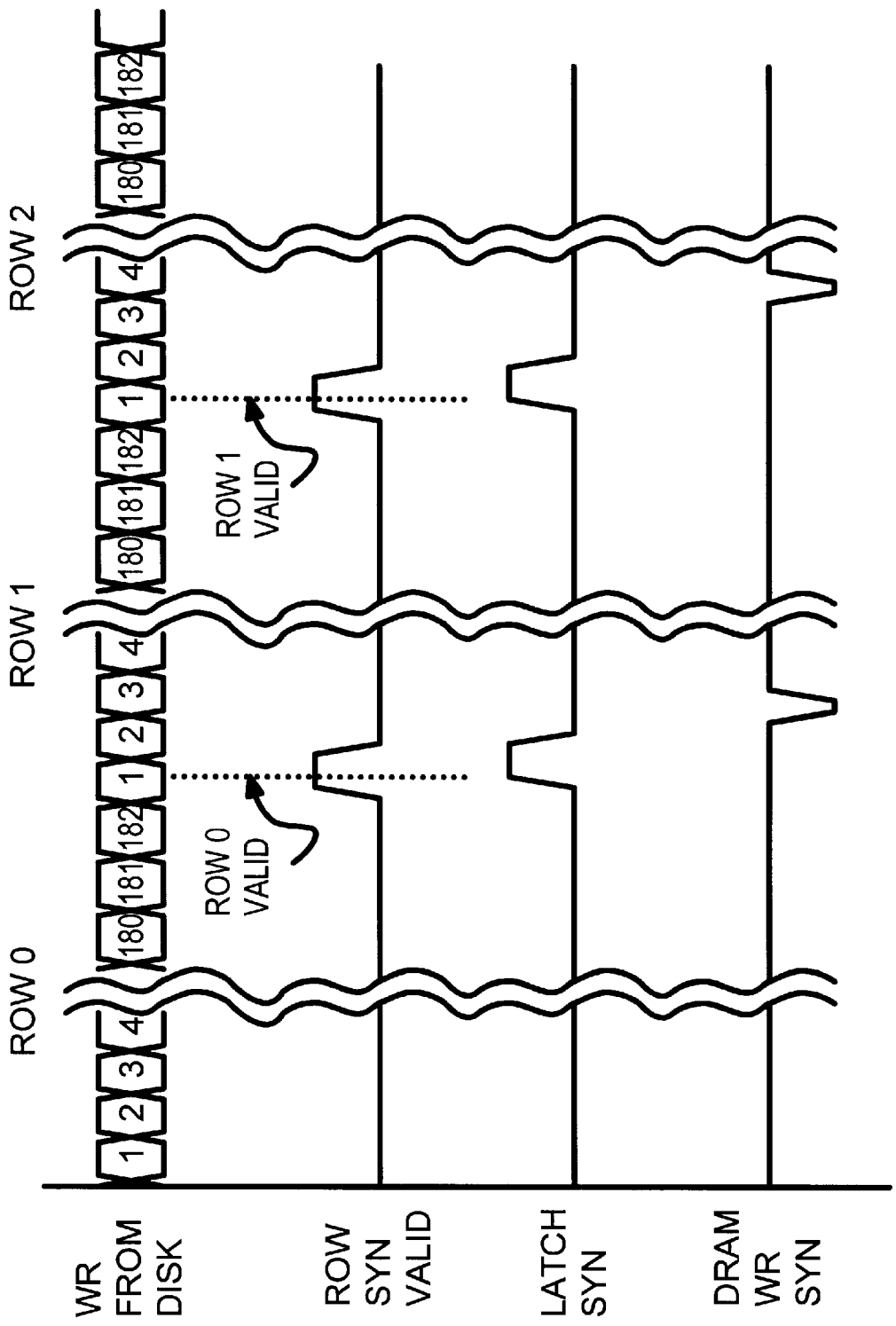
FIG. 8 shows that row syndromes generated on-the-fly are written to the embedded DRAM once generated.

Row-Syndromes Written to DRAM—FIG. 8

FIG. 8 shows that row syndromes generated on-the-fly are written to the embedded DRAM once generated. As each of the 182 data and ECC bytes in a row are read from the optical disk and written into the DRAM buffer, the bytes are also accumulated into the row syndrome being generated. After the last ECC byte in the row is accumulated, the row syndrome bytes are available from the row-syndrome generator.

The row-syndrome generator holds the row syndrome valid for a short period after the end of the row, before the syndrome generator is cleared for the next row. The valid row syndrome is latched into a write buffer by the LATCH_SYN signal. The write buffer requests access to the embedded DRAM, but may have to wait for other tasks to complete before the row-syndrome write buffer wins arbitration. Thus the amount of time until the row syndromes are written to the embedded DRAM varies. Once arbitration is won, the row-syndrome write buffer writes the row syndromes to the row-syndrome area of the embedded DRAM using the DRAM_WR signal.

Figure 9:
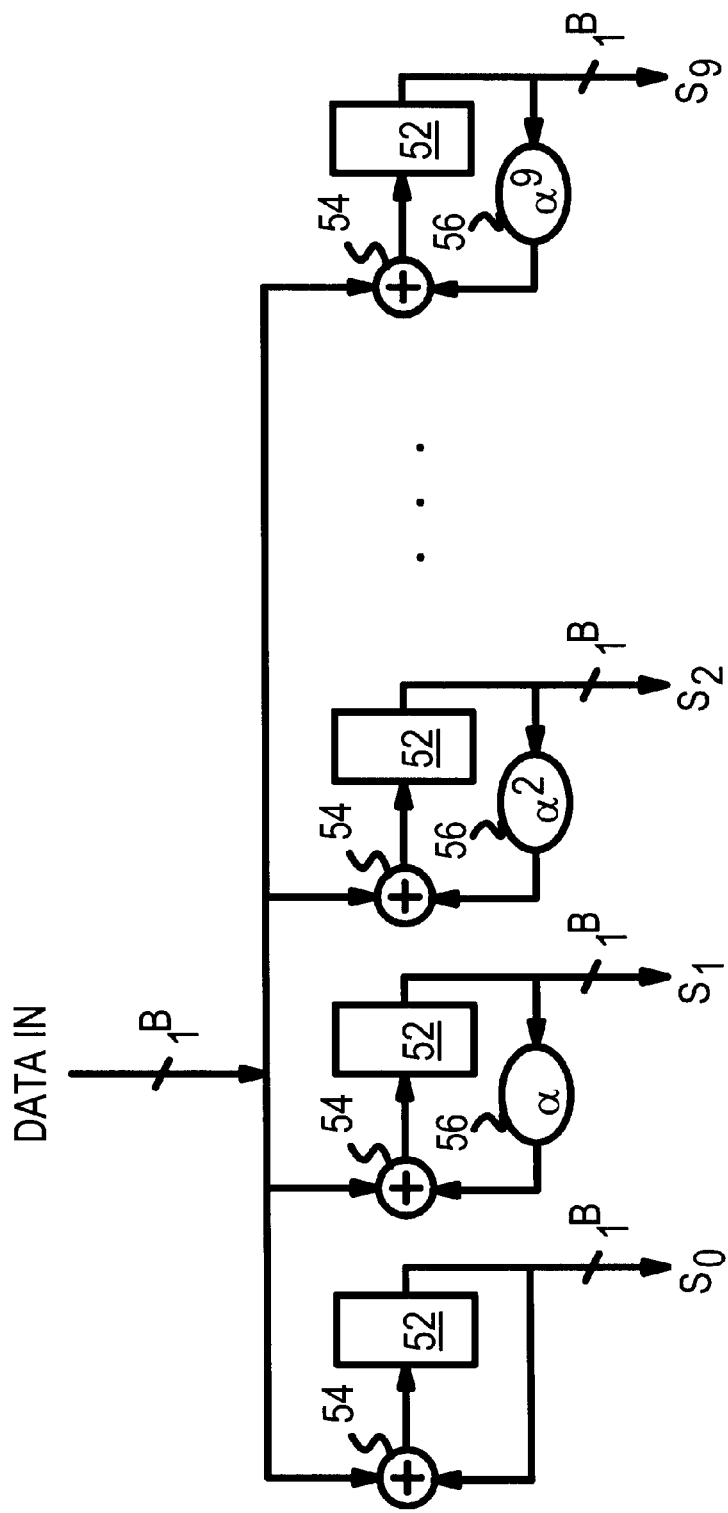
FIG. 9 is a schematic diagram of a row-syndrome generator.

Row Syndrome Generator—FIG. 9

FIG. 9 is a schematic diagram of a row-syndrome generator. The entire row of 172 data bytes and 10 ECC bytes is considered one codeword for syndrome generation. Each row, including both the data and appended ECC bytes, is a Reed-Solomon codeword that is first decoded by syndrome generation. The code is based on a proprietary polynomial generator described in the DVD specification.

The row code is a Reed-Solomon (n,k)=(182,172) code. The 182 input bytes in a row are reduced to a 10-byte (n-k) syndrome. The generated syndrome is in some ways like a compressed cyclical-redundancy checksum. The first data byte is considered the most-significant-byte (MSB) of the 182-byte codeword, while the final ECC byte of the row is the least-significant-byte (LSB).

The MSB of the row, the first data byte, enters the row syndrome generator first. After calculations are made, the next byte in the row enters the syndrome generator and is accumulated into the syndrome generated from the first byte by performing more calculations. Then the third byte in the row is input to the syndrome generator and accumulated into the syndrome generated from the first and second bytes. Each successive byte in the row is successively input to the row-syndrome generator and alters the syndrome being generated. Once all data and ECC bytes have been input to the syndrome generator, the finally value of the 10-byte syndrome is read out of registers in the row-syndrome generator.

The row syndrome is represented by the syndrome polynomial:

$$S(x)=S_9x^9+S_8x^8+\ldots+S_1x+S_0.$$

where the ten coefficients $S_j$ are the ten bytes read out of the registers at the end of syndrome generation for a row. Each of the ten syndrome coefficients is thus an 8-bit byte, representing a value in a 256-element Galois field. Coefficient $S_9$ is the most-significant byte while coefficient $S_0$ is the least-significant byte of the 10-byte row syndrome.

The $S_j$ coefficients are calculated from the row codeword $r(x)$ as $S_j=r(x)$ where $x=\alpha^j$, or $S_j=r(\alpha^j)$. Alpha ($\alpha$) is the primitive element of the Galois field. The row codeword $r(x)$ is:

$$r(x)=r_{181}x^{181}+r_{180}x^{180}+\ldots+r_2x^2+r_1x+r_0$$

where $r_{181}$ is the first data byte (MSB) in the row, $r_{180}$ is the second data byte, $r_1$ is the second-to-last ECC byte in the row, and $r^0$ is the last ECC byte in the row, the LSB. When calculating each syndrome coefficient $S_j$, the variable x is replaced with $\alpha^j$.

Thus since $j=0$ for $S_0$, and $\alpha^0$ is 1, the least-significant syndrome coefficient $S_0$ is $$S_0=r_{181}+r_{180}+\ldots+r_2+r_1+r_0.$$

The second-least-significant syndrome coefficient $S_1$ is $$S_1=r_{181}\alpha^{181}+r_{180}\alpha^{180}+\ldots+r_2\alpha^2+r_1\alpha+r_0.$$

Having $j=9$, the most-significant syndrome coefficient $S_9$ is $$S_9=r_{181}\alpha^{181\cdot 9}+r_{180}\alpha^{180\cdot 9}+\ldots+r_2\alpha^{2\cdot 9}+r_1\alpha^9+r_0.$$

FIG. 9 shows the row-syndrome generator circuit that implements these equations to generate the ten syndrome coefficients $S_9$ to $S_0$. Each of the 182 data and ECC bytes for the row are input as a byte on the DATA IN bus. These bytes are input one after the other, so 182 clock cycles are required to input the entire row of bytes. Each byte being input is sent to all ten adders 54 to be combined or accumulated with intermediate syndrome coefficients stored in registers 52. These intermediate syndrome coefficients stored in registers 52 are first scaled by multipliers 56. All registers are initialized or cleared with zero values.

The scaling constants increase with higher-order coefficients. For example, intermediate coefficient $S_9$ from the right-most register 52 is scaled by $\alpha^9$ in multiplier 56 before being added to the next data or ECC byte input. However, intermediate coefficient $S_2$ from register 52 is scaled by $\alpha^2$ in its multiplier 56 before being added to the next data or ECC byte input. The least-significant coefficient $S_0$ is scaled by $\alpha^0$, which is simply 1, requiring no multiplier.

The final syndrome coefficients in registers 52 after all 182 bytes in the row are input during 182 clock cycles are the final row-syndrome coefficients. For the least-significant coefficient $S_0$, each of the 182 bytes are added to the running sum in the left-most register 52. This implements the equation:

$$S_0=r_{181}+r_{180}+\ldots+r_2+r_1+r_0.$$

For the next least-significant coefficient $S_1$, each of the 182 bytes are added to the running sum in the next-left-most register 52. The running sum from register 52 is first scaled by a for each iteration or new byte added. Thus the last ECC byte is simply added while the second-to-last ECC byte $r_1$ is multiplied by a only once. The third-to-last ECC byte $r_2$ is multiplied by a twice, or $\alpha^2$. The first-input, most-significant byte, $r_{11}$ is looped from register 52 through multiplier 56 181 times, so byte $r_{181}$ is effectively multiplied by $\alpha^{181}$. This implements the equation:

$$S_1 = r_{181}\alpha^{181} + r_{180}\alpha^{180} + \ldots + r_2\alpha^2 + r_1\alpha + r_0.$$

Likewise, the most-significant coefficient $S_9$ multiplies the intermediate coefficient stored in the right-most register 52 by $\alpha^9$ for each loop. The last ECC byte is not multiplied by $\alpha^9$, but the second-to-last ECC byte is multiplied by $\alpha^9$ just once. The third-to-last ECC byte is multiplied by $\alpha^9$ twice. The first-input, most-significant byte, $r_{181}$ is looped from register 52 through multiplier 56 and multiplied by $\alpha^9$ a total of 181 times, so byte $r_{181}$ is effectively multiplied by $\alpha^{181*9}$. This implements the equation:

$$S_9 = r_{181}\alpha^{181*9} + r_{180}\alpha^{180*9} + \ldots + r_2\alpha^{2*9} + r_1\alpha^9 + r_0.$$

Thus the circuits for row-syndrome generator 28 in FIG. 9 generate the ten syndrome coefficients by iterating over all 182 input bytes from a row.

ADVANTAGES OF THE INVENTION

Data from the optical disk is sent in parallel to both the buffer and to the row syndrome generator. The row syndrome generator no longer has to read all the bytes in each row from the buffer. One of the reads of all bytes in the ECC data block is eliminated using on-the-fly row-syndrome generation.

The row syndromes are generated quickly, being available for error detection and correction almost immediately after the entire row has been received. Eliminating the DRAM read for row-syndrome generation frees up bandwidth of the embedded DRAM, making access bandwidth available for other tasks, such as for writes from disk, and for column-syndrome generation reads or for host buffering reads.

A high-speed optical-disk playback system uses on-the-fly row-syndrome generation with delayed column-syndrome generation and error correction. It performs error correction or detection as quickly as possible, so that error correction does not force the disk to stall while error correction occurs. A virtual on-the-fly error corrector does not use an expensive SRAM buffer. Instead, a DRAM buffer is used for error correction. Bandwidth requirements for error correction are reduced, improving performance, by eliminating buffer data reads for row-syndrome generation. Since all bytes in the ECC block have to be read for row-syndrome generation, the amount of DRAM reads eliminated is significant. A more efficient row syndrome-generation system is thus achieved.

ALTERNATE EMBODIMENTS

Several other embodiments are contemplated by the inventors. For example FIFO buffers or pipeline latches can be inserted into the circuitry at many points, such as to and from the embedded memory. XNOR rather than XOR gates can be used in the adder, and an extra inverter added in the registers. Other circuit implementations are possible too. Many variations of Reed-Solomon code can be used for the ECC bytes as the invention is not limited to a certain type of coding or error-correction methods. Different polynomial generators for the Reed-Solomon code can be used, as can different Galois fields. While the term byte has been used with reference to an 8-bit quantity, it should be realized that other data widths can be used. For example, it is possible that future DVD systems will operate on two or four-byte data words or fields. Each column is then the width of one data word or field. When the optical disk is a CD-ROM optical disk, the column-syndrome generator receives data words from the two diagonals for Q-parity syndrome generation, or for CD columns.

While a four-byte fetch or read from the buffer memory has been described, other fetch sizes can be used with the invention. With embedded memories in particular, much larger fetch sizes are common. For example, a 128-bit (16-byte) interface is used by the assignee for an embedded memory in a graphics controller, and a 256-bit (32-byte) interface is contemplated. Such a wide interface is practical for embedded memories but not for external memories because package pins on the chip are not needed for the memory interface when embedded memories are used.

The fetch size is typically defined by the width in bytes of the interface between the memory and other circuits. Sometimes this width can vary, perhaps being larger for the host or disk interface but smaller for interfaces to ECC blocks.

Timing of the various pipelined blocks can be controlled by a central controller. Flags or bits can be set or cleared upon completion of tasks for a block, such as completion of reading from the DVD disk, completion of generation of all the row syndromes, row error correction, etc. DVD-RAMs that are writeable can be used when the invention is modified for writing as well as reading data from the disk. The invention may be adapted for future extensions of DVD or future optical disk standards. The invention can also be applied to non-computer DVD systems, such as consumer electronics DVD video players.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A partially on-the-fly syndrome generator system comprising:

a disk interface, coupled to receive uncorrected data words read from an optical disk, the uncorrected data words representing a block, the block comprising rows and columns, the block comprising rows of data words and error-correction words and columns of data words and error-correction words;

a buffer memory, coupled to receive the uncorrected data words from the disk interface, for storing the uncorrected data words as a block of data words and error-correction words for the data;

a row-syndrome generator, coupled to the disk interface to receive the uncorrected data words directly from the disk interface, for generating a row syndrome for each row in the block, the row-syndrome generator outputting a row syndrome for detecting errors in the row; and a column-syndrome generator, coupled to the buffer memory, for reading data words of a column in the buffer memory from all rows in the block, the column-syndrome generator having registers for storing a column syndrome, the column syndrome for detecting errors in the column, whereby the row syndrome is generated on-the-fly from the uncorrected data words received directly from the disk interface, but the column syndrome is generated by reading data words from the buffer memory.

2. The partially on-the-fly syndrome generator system of claim 1 wherein the row-syndrome generator does not read the data words from the buffer memory, wherein the row-syndrome generator receives data words from the disk interface and not from the buffer memory, whereby buffer reads for row-syndrome-generation are eliminated.

3. The partially on-the-fly syndrome generator system of claim 2 further comprising:

an error corrector, reading the row syndrome, for detecting an error in the row by examining the row syndrome, the error corrector locating and correcting an error detected in the row by writing to the column in the buffer memory, whereby the error corrector corrects row errors.

4. The partially on-the-fly syndrome generator system of claim 3 wherein the error corrector further detects, locates, and corrects errors in columns by examining the column syndrome from each column and writing a correction to the buffer memory, whereby the error corrector corrects column errors.

5. The partially on-the-fly syndrome generator system of claim 4 wherein the error corrector is pipelined with the column-syndrome generator.

6. The partially on-the-fly syndrome generator system of claim 4 wherein the error corrector is a shared corrector used for correcting column errors and used for correcting row errors.

7. The partially on-the-fly syndrome generator system of claim 4 wherein the error corrector corrects errors for all rows of the block before the column-syndrome generator fetches data words from the block, whereby the data words in the block are first corrected using row syndromes before the column syndromes are generated.

8. The partially on-the-fly syndrome generator system of claim 3 wherein the row-syndrome generator outputs the row syndrome to the error corrector, the error corrector detecting, locating, and correcting errors in the row by writing corrections to the row in the buffer memory, whereby the row syndrome is sent directly to the error corrector.

9. The partially on-the-fly syndrome generator system of claim 3 wherein the row-syndrome generator writes the row syndrome to the buffer memory, the error corrector reading the row syndrome from the buffer memory, the error corrector detecting, locating, and correcting errors in the row by writing corrections to the row in the buffer memory, whereby the row syndrome is stored in the buffer memory until error correction.

10. The partially on-the-fly syndrome generator system of claim 3 further comprising:

a host interface, coupled to the buffer memory, for transferring the data words in the block after error correction to a host, whereby a separate host buffer memory is avoided.

11. The partially on-the-fly syndrome generator system of claim 3 wherein the data words read from the optical disk are converted by demodulation from modulated data words stored on the optical disk.

12. The partially on-the-fly syndrome generator system of claim 3 wherein the buffer memory is an embedded memory on a same integrated circuit chip as the row-syndrome generator.

13. The partially on-the-fly syndrome generator system of claim 3 wherein a last set of data words in each row of the block contain error-correction words, the error-correction words being combined in the row-syndrome generator into the row syndrome.

14. The partially on-the-fly syndrome generator system of claim 3 wherein the block is read from an optical disk to the buffer memory, wherein syndromes are generated for a DVD optical disk or a CD-ROM optical disk, wherein when the optical disk is a CD-ROM optical disk, the column-syndrome generator receives data words from diagonals for Q-parity syndrome generation, whereby the column-syndrome generator is used to generate syndromes for DVD columns and for CD-ROM diagonals.

15. A method of playback of data from a DVD disk comprising:

reading a block of data from the DVD disk by writing a data stream from the DVD disk to rows of a block in a buffer memory;

as each current row of the block of the buffer memory is being transferred from the DVD disk to the buffer memory:

also sending the current row of data to a row-syndrome generator;

generating a row syndrome for the current row without reading the data from the buffer memory;

sending the row syndrome to an error corrector, the error corrector examining the row syndrome to detect an error in the current row;

correcting errors detected in the current row by writing corrected data to the current row at a location determined from the row syndrome;

wherein the block becomes a row-corrected block once all rows have been corrected;

after all rows of the block have been transferred from the DVD disk to the buffer memory:

transferring a next block to the buffer memory and generating row syndromes and making row corrections for the next block;

processing a first column in the row-corrected block by:

for each row of the row-corrected block:

reading a data byte from a row;

sending the data byte to a column-syndrome generator;

accumulating in the column-syndrome generator the data byte into a first column syndrome;

after reading the data byte from all rows in the row-corrected block, outputting the first column syndrome to the error corrector;

using the first column syndrome in the error corrector to detect, evaluate, locate, and correct any errors in a first column;

wherein after all columns have been corrected the row-corrected block becomes a row-and-column-corrected block;

transferring the row-and-column-corrected block to a host, whereby row and column syndrome generation is pipelined.

* * * * *